United States Patent
Hosseini et al.

(10) Patent No.: US 10,686,472 B2
(45) Date of Patent: Jun. 16, 2020

(54) METHODS AND APPARATUS FOR ACHIEVING LOW CODING RATES

(71) Applicant: QUALCOMM Incorporated, San Diego, CA (US)

(72) Inventors: Seyedkianoush Hosseini, San Diego, CA (US); Alberto Rico Alvarino, San Diego, CA (US); Wanshi Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 86 days.

(21) Appl. No.: 15/874,804

(22) Filed: Jan. 18, 2018

(65) Prior Publication Data

US 2018/0212627 A1 Jul. 26, 2018

Related U.S. Application Data

(60) Provisional application No. 62/448,930, filed on Jan. 20, 2017.

(51) Int. Cl.
*H03M 13/00* (2006.01)
*H03M 13/27* (2006.01)
(Continued)

(52) U.S. Cl.
CPC ....... *H03M 13/2771* (2013.01); *H03M 13/09* (2013.01); *H03M 13/091* (2013.01);
(Continued)

(58) Field of Classification Search
None
See application file for complete search history.

(56) References Cited

U.S. PATENT DOCUMENTS

| 6,898,743 B2 * | 5/2005 | Yoon ............... H04L 1/0009 341/61 |
| 2002/0022468 A1 * | 2/2002 | Yoon ............... H04L 1/08 455/403 |

(Continued)

OTHER PUBLICATIONS

Christian Schlegel; Lance Perez, "Parallel Concatenation (Turbo Codes)," in Trellis and Turbo Coding , , IEEE, 2004, pp. 285-327 (Year: 2004).*

(Continued)

*Primary Examiner* — Daniel F. McMahon
(74) *Attorney, Agent, or Firm* — Arent Fox LLP

(57) ABSTRACT

In an aspect, an apparatus receives content to be transmitted and generates a first turbo encoded codeword from the content through use of a first turbo encoder. The apparatus is further configured to generate an interleaved codeword based on the first turbo encoded codeword through use of an interleaver, generate a second turbo encoded codeword from the interleaved codeword through use of a second turbo encoder, and transmit at least a portion of the second turbo encoded codeword. In another aspect, an apparatus receives data including outer turbo encoded, interleaved, inner turbo encoded content. The apparatus generates a first decoded instance of the data, generates a de-interleaved instance of the data based on the first decoded instance of the data, generates a second decoded instance of the data from the de-interleaved instance of the data, and performs a CRC on the second decoded instance of the data.

30 Claims, 10 Drawing Sheets

(51) Int. Cl.
*H03M 13/23* (2006.01)
*H03M 13/29* (2006.01)
*H03M 13/09* (2006.01)
*H04L 1/18* (2006.01)
*H03M 13/35* (2006.01)
*H04L 1/00* (2006.01)

(52) U.S. Cl.
CPC ..... *H03M 13/235* (2013.01); *H03M 13/2942* (2013.01); *H03M 13/2966* (2013.01); *H03M 13/35* (2013.01); *H03M 13/611* (2013.01); *H03M 13/635* (2013.01); *H03M 13/6306* (2013.01); *H04L 1/005* (2013.01); *H04L 1/0066* (2013.01); *H04L 1/0071* (2013.01); *H04L 1/1819* (2013.01); *H04L 1/0067* (2013.01)

(56) References Cited

U.S. PATENT DOCUMENTS

| | | | | |
|---|---|---|---|---|
| 2003/0053435 | A1* | 3/2003 | Sindhushayana | H04L 1/0003 370/342 |
| 2003/0135807 | A1* | 7/2003 | Lim | H03M 13/2903 714/755 |
| 2008/0046800 | A1* | 2/2008 | Pietraski | H03M 13/2957 714/790 |
| 2008/0141103 | A1* | 6/2008 | Miyazaki | H03M 13/2957 714/801 |
| 2009/0199062 | A1* | 8/2009 | Shen | H03M 13/2957 714/748 |
| 2011/0235723 | A1* | 9/2011 | Limberg | H03M 13/2732 375/240.25 |
| 2015/0098420 | A1* | 4/2015 | Luo | H04L 1/0025 370/329 |

OTHER PUBLICATIONS

International Search Report and Written Opinion—PCT/US2018/014457—ISA/EPO—dated May 11, 2018.
Keita Miwa et al: "Performance of Decision-Directed Channel Estimation Using Low-Rate Turbo Codes for DFT-Precoded OFDMA", Proc. IEEE 75th Vehicular Technology Conference (VTC Spring 2012): Yokohama, Japan, May 6-9, 2012, IEEE, Piscataway, NJ, May 6, 2012 (May 6, 2012), XP032202720, pp. 1-5, DOI: 10.1109/VETECS.2012.6240303, ISBN: 978-1-4673-0989-9.
Miguel Griot et al: "On the Design of Arbitrarily Low-Rate Turbo-Codes", Proc. IEEE Global Telecommunications Conference 2007 (GLOBECOM '07), IEEE, Piscataway, NJ, USA, Nov. 1, 2007 (Nov. 1, 2007), XP031196211, pp. 1472-1475, ISBN: 978-1-4244-1042-2.
Shunji Miyazaki et al: "Link-Level Evaluations of Low Rate Code Extensions of Turbo Codes Using Shortened Code Techniques," Proc. IEEE Vehicular Technology Conference 2007 (VTC 2007 Fall) IEEE, Sep. 1, 2007 (Sep. 1, 2007), XP031147559, pp. 1017-1021, ISBN: 978-1-4244-0263-2.
Sina Vafi et al: "Serially Concatenated Turbo Codes," Proc. 5th International Conference on Wireless Communications, Networking and Mobile Computing 2009 (WICOM '09), IEEE, Piscataway, NJ, USA, Sep. 24, 2009 (Sep. 24, 2009), XP031555331, pp. 1-4, ISBN: 978-1-4244-3692-7.

* cited by examiner

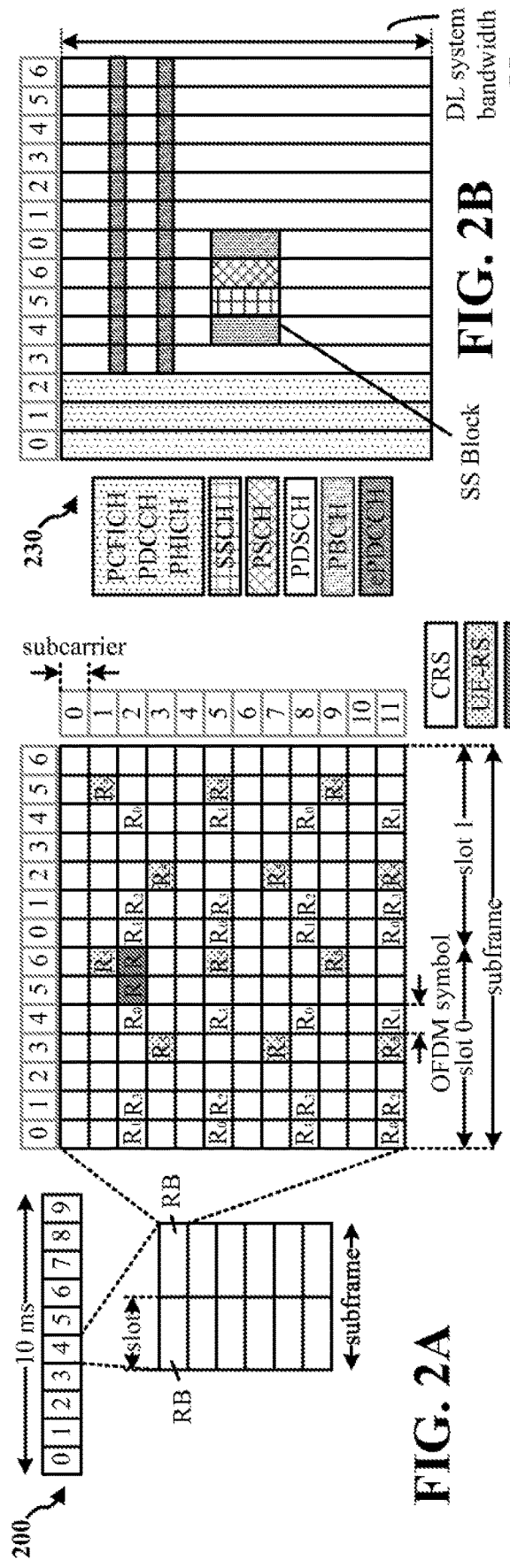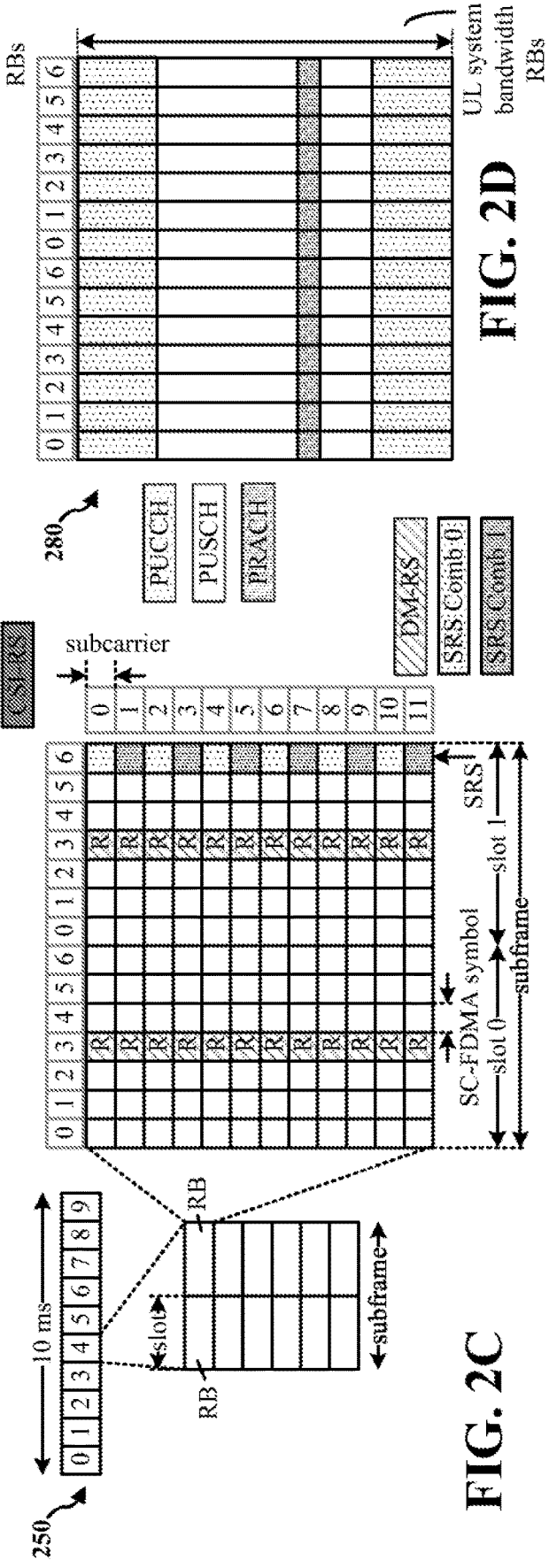

METHODS AND APPARATUS FOR ACHIEVING LOW CODING RATES

CROSS-REFERENCE TO RELATED APPLICATION(S)

This application claims the benefit of U.S. Provisional Application Ser. No. 62/448,930 entitled "METHODS AND APPARATUS FOR ACHIEVING LOW CODING RATES" filed on Jan. 20, 2017, which is expressly incorporated by reference herein in its entirety.

BACKGROUND

Field

The present disclosure relates generally to communication systems, and more particularly, to methods and apparatus that facilitate achieving low coding rates for data transmission, e.g., using turbo encoders.

Background

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

In many communication systems, improved transmission reliability is highly desirable. To achieve enhanced transmission reliability, coding schemes and/or encoders that may allow achieving low mother code rates are desirable.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Various features and aspects that facilitate achieving low coding rates for data transmission, e.g., using turbo encoders, in a communication system are described. In an aspect of the disclosure, a method, a computer-readable medium, and an apparatus are provided. The apparatus may be configured to receive content to be transmitted, the content including source data portion and a cyclic redundancy check (CRC) portion, and generate a first turbo encoded codeword from the content through use of a first turbo encoder, where the first turbo encoder may be associated with a first code rate. The apparatus may be further configured to determine whether an intended code rate for the content to be transmitted is less than the first code rate. In one configuration, when the intended code rate is determined to be less than the first code rate, the apparatus may be further configured to generate an interleaved codeword based on the first turbo encoded codeword through use of an interleaver, generate a second turbo encoded codeword from the interleaved codeword through use of a second turbo encoder, and transmit at least a portion of the second turbo encoded codeword. In one configuration, when the intended code rate is determined to be not less than the first code rate, the apparatus may be further configured to transmit at least a portion of the first turbo encoded codeword. The apparatus may be a super encoder as described herein, or a communication device such as a base station, a user equipment (UE), modem or another such device that includes the super encoder.

In another aspect of the disclosure, a method, a computer-readable medium, and an apparatus are provided. The apparatus may be configured to receive data, the data including outer turbo encoded, interleaved, inner turbo encoded content. The content may include source data portion and a CRC portion. In some configurations, the apparatus may be further configured to generate a first decoded instance of the data through use of a first turbo decoder, the first turbo decoder decodes an inner turbo encoded portion of the received data, generate a de-interleaved instance of the data based on the first decoded instance of the data through use of a de-interleaver, and generate a second decoded instance of the data from the de-interleaved instance of the data through use of a second turbo decoder, where the second turbo decoder decodes an outer turbo encoded portion of the received data. In some configurations, the apparatus may be further configured to perform a CRC (check) on the second decoded instance of the data to determine whether the data is successfully received. The apparatus may be a super decoder as described herein, or a communication device such as a base station, UE, modem or another such device that includes the super decoder.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIGS. 2A, 2B, 2C, and 2D are diagrams illustrating LTE examples of a DL frame structure, DL channels within the DL frame structure, an UL frame structure, and UL channels within the UL frame structure, respectively.

DETAILED DESCRIPTION

Figure 1:
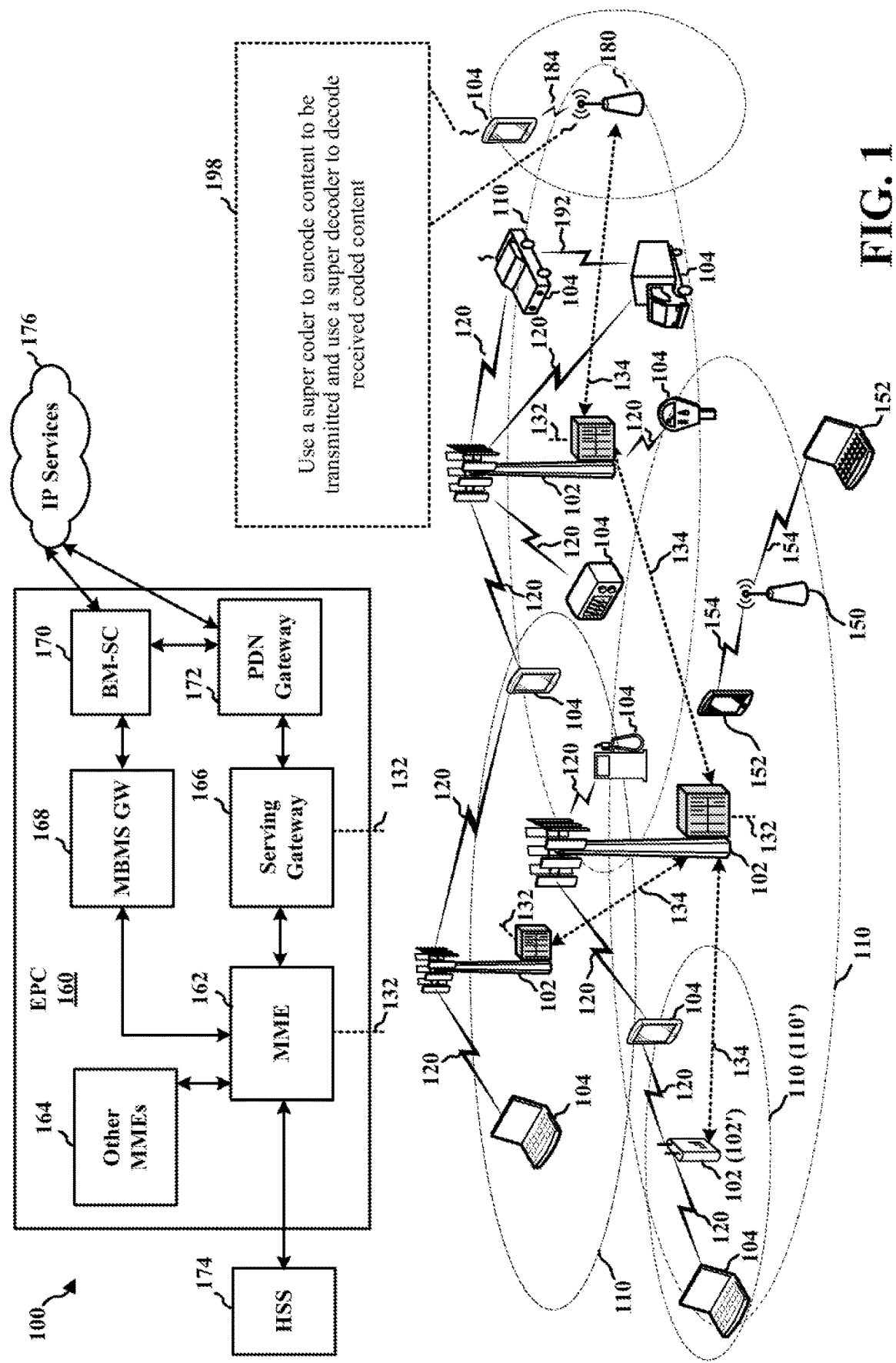
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, and an Evolved Packet Core (EPC) 160. The base stations 102 may include macro cells (high power cellular base station) and/or small cells (low power cellular base station). The macro cells include eNBs. The small cells include femtocells, picocells, and microcells.

The base stations 102 (collectively referred to as Evolved Universal Mobile Telecommunications System (UMTS) Terrestrial Radio Access Network (E-UTRAN)) interface with the EPC 160 through backhaul links 132 (e.g., S1 interface). In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macro cells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use MIMO antenna technology, including spatial multiplexing, beamforming, and/or transmit diversity. The communication links may be through one or more carriers. The base stations 102/UEs 104 may use spectrum up to Y MHz (e.g., 5, 10, 15, 20 MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

The millimeter wave (mmW) base station 180 may operate in mmW frequencies and/or near mmW frequencies in communication with the UE 182. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 180 may utilize beamforming 184 with the UE 182 to compensate for the extremely high path loss and short range.

The EPC 160 may include a Mobility Management Entity (MME) 162, other MMES 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service (PSS), and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The base station may also be referred to as a Node B, evolved Node B (eNB), an access point, a base transceiver station, a radio base station, a radio transceiver, a transceiver function, a basic service set (BSS), an extended service set (ESS), or some other suitable terminology. The base station 102 provides an access point to the EPC 160 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, or any other similar functioning device. The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 1, in certain aspects, a base station (e.g., base station 180 or 102) and/or the UE 104 may use a super encoder as described herein to encode content to be transmitted (198). For example, in one aspect, a communication device (e.g., base station 180 and/or the UE 104) of the access network 100 may have content to be transmitted (e.g., to another device), where the content may include source data portion and a CRC portion. The communication device may generate a first turbo encoded codeword from the content through use of a first turbo encoder, where the first turbo encoder may be associated with a first code rate. The communication device may determine whether an intended code rate for the content to be transmitted is less than the first code rate. In one configuration, when the intended code rate is determined to be less than the first code rate, the communication device may generate an interleaved codeword based on the first turbo encoded codeword through use of an interleaver, generate a second turbo encoded codeword from the interleaved codeword through use of a second turbo encoder, and transmit at least a portion of the second turbo encoded codeword. In one configuration, when the intended code rate is determined to be not less than the first code rate, the apparatus may be further configured to transmit at least a portion of the first turbo encoded codeword. In certain aspects, the communication device (e.g., base station 180 and/or the UE 104) may use a super decoder as described herein to decode received encoded content (198). For example, in one aspect, the communication device may receive data including outer turbo encoded, interleaved, inner turbo encoded content. The communication device may generate a first decoded instance of the data through use of a first turbo decoder, where the first turbo decoder decodes an inner turbo encoded portion of the received data. The communication device may then generate a de-interleaved instance of the data based on the first decoded instance of the data through use of a de-interleaver, and generate a second decoded instance of the data from the de-interleaved instance of the data through use of a second turbo decoder, where the second turbo decoder decodes an outer turbo encoded portion of the received data. In some configurations, the communication device may perform a CRC on the second decoded instance of the data to determine whether the data is successfully received/decoded.

FIG. 2A is a diagram 200 illustrating an example of a DL frame structure in LTE. FIG. 2B is a diagram 230 illustrating an example of channels within the DL frame structure in LTE. FIG. 2C is a diagram 250 illustrating an example of an UL frame structure in LTE. FIG. 2D is a diagram 280 illustrating an example of channels within the UL frame structure in LTE. Other wireless communication technologies may have a different frame structure and/or different channels. In LTE, a frame (10 ms) may be divided into 10 equally sized subframes. Each subframe may include two consecutive time slots. A resource grid may be used to represent the two time slots, each time slot including one or more time concurrent resource blocks (RBs) (also referred to as physical RBs (PRBs)). The resource grid is divided into multiple resource elements (REs). In LTE, for a normal cyclic prefix, an RB contains 12 consecutive subcarriers in the frequency domain and 7 consecutive symbols (for DL, OFDM symbols; for UL, SC-FDMA symbols) in the time domain, for a total of 84 REs. For an extended cyclic prefix, an RB contains 12 consecutive subcarriers in the frequency domain and 6 consecutive symbols in the time domain, for a total of 72 REs. The number of bits carried by each RE depends on the modulation scheme.

As illustrated in FIG. 2A, some of the REs carry DL reference (pilot) signals (DL-RS) for channel estimation at the UE. The DL-RS may include cell-specific reference signals (CRS) (also sometimes called common RS), UE-specific reference signals (UE-RS), and channel state information reference signals (CSI-RS). FIG. 2A illustrates CRS for antenna ports 0, 1, 2, and 3 (indicated as R0, R1, R2, and R3, respectively), UE-RS for antenna port 5 (indicated as R5), and CSI-RS for antenna port 15 (indicated as R). FIG. 2B illustrates an example of various channels within a DL subframe of a frame. The physical control format indicator channel (PCFICH) is within symbol 0 of slot 0, and carries a control format indicator (CFI) that indicates whether the physical downlink control channel (PDCCH) occupies 1, 2, or 3 symbols (FIG. 2B illustrates a PDCCH that occupies 3 symbols). The PDCCH carries downlink control information (DCI) within one or more control channel elements (CCEs), each CCE including nine RE groups (REGs), each REG including four consecutive REs in an OFDM symbol. A UE may be configured with a UE-specific enhanced PDCCH (ePDCCH) that also carries DCI. The ePDCCH may have 2, 4, or 8 RB pairs (FIG. 2B shows two RB pairs, each subset including one RB pair). The physical hybrid automatic repeat request (ARQ) (HARQ) indicator channel (PHICH) is also within symbol 0 of slot 0 and carries the HARQ indicator (HI) that indicates HARQ acknowledgement (ACK)/negative ACK (NACK) feedback based on the physical uplink shared channel (PUSCH). The primary synchronization channel (PSCH) is within symbol 6 of slot 0 within subframes 0 and 5 of a frame, and carries a primary synchronization signal (PSS) that is used by a UE to determine subframe timing and a physical layer identity. The secondary synchronization channel (SSCH) is within symbol 5 of slot 0 within subframes 0 and 5 of a frame, and carries a secondary synchronization signal (SSS) that is used by a UE to determine a physical layer cell identity group number. Based on the physical layer identity and the physical layer cell identity group number, the UE can determine a physical cell identifier (PCI). Based on the PCI, the UE can determine the locations of the aforementioned DL-RS. The physical broadcast channel (PBCH) is within symbols 0, 1, 2, 3 of slot 1 of subframe 0 of a frame, and carries a master information block (MIB). The MIB provides a number of RBs in the DL system bandwidth, a PHICH configuration, and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry demodulation reference signals (DM-RS) for channel estimation at the eNB. The UE may additionally transmit sounding reference signals (SRS) in the last symbol of a subframe. The SRS may have a comb structure, and a UE may transmit SRS on one of the combs. The SRS may be used by an eNB for channel quality estimation to enable frequency-dependent scheduling on the UL. FIG. 2D illustrates an example of various channels within an UL subframe of a frame. A physical random access channel (PRACH) may be within one or more subframes within a frame based on the PRACH configuration. The PRACH may include six consecutive RB pairs within a subframe. The PRACH allows the UE to perform initial system access and achieve UL synchronization. A physical uplink control channel (PUCCH) may be located on edges of the UL system bandwidth. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
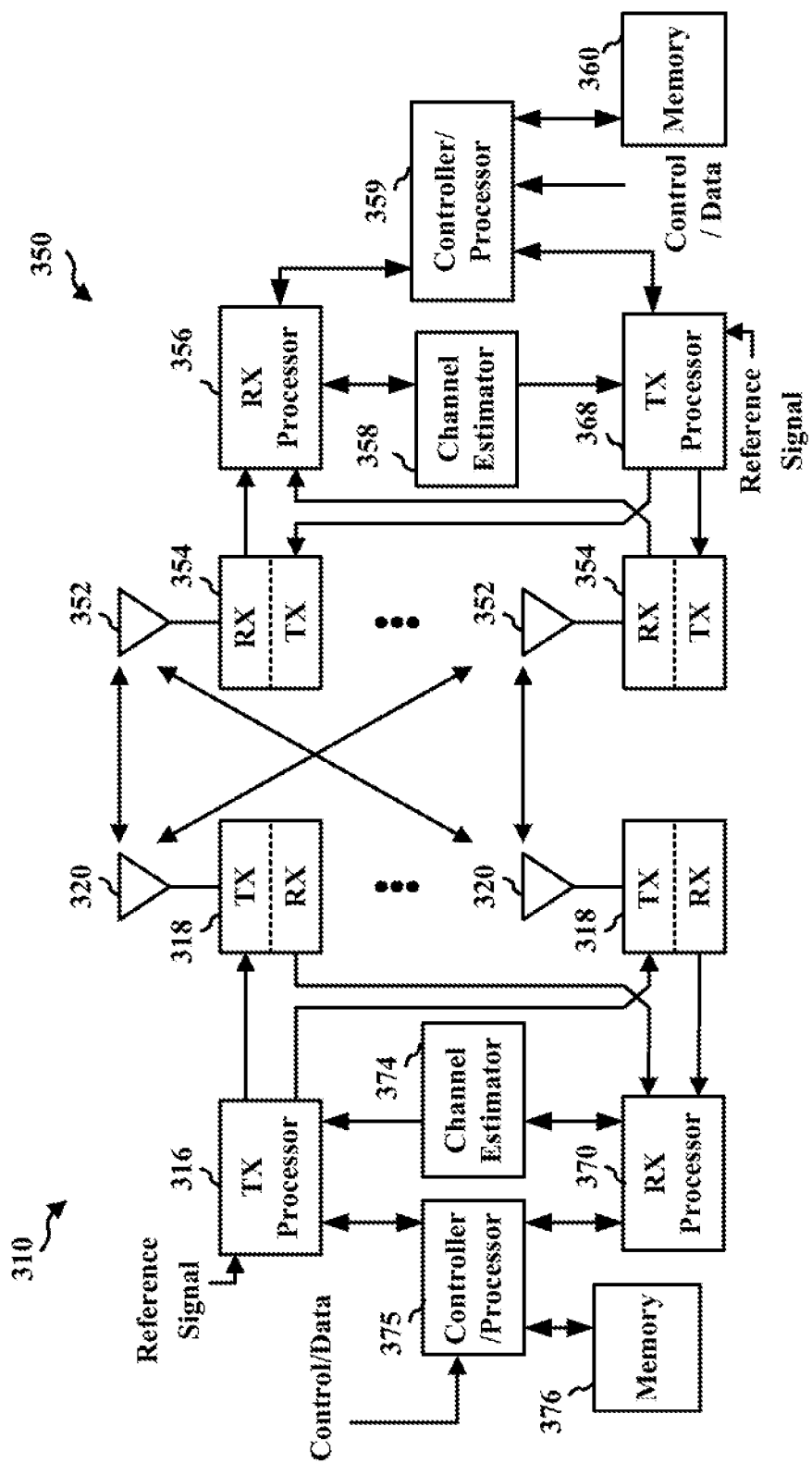
FIG. 3 is a diagram illustrating an example of an evolved Node B (eNB) and UE in an access network.

FIG. 3 is a block diagram of an eNB 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/ demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the eNB 310. These soft decisions may be based on channel estimates computed by the channel estimator 358. The soft decisions are then decoded and deinterleaved to recover the data and control signals that were originally transmitted by the eNB 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the eNB 310, the controller/processor 359 provides RRC layer functionality associated with system information (e.g., MIB, SIBS) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the eNB 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the eNB 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

There has been an increased interest in enhancing short transmission time interval (sTTI) operations in communication systems including LTE and NR systems. While the focus may be enhancing sTTI operations, one of the objectives is to support Ultra-Reliable and Low-Latency Communications (URLLC) among devices operating in the communication system. Many new and future applications will demand an end-to-end latency of a few milliseconds, and additionally in many wireless communication fields high transmission reliability is required. Given that one of the objectives of LTE URLLC is to enhance transmission reliability, it is desirable to be able to achieve low mother code rates, e.g., lower than coding rate of 1/3. Furthermore, it is desirable to find solutions where LTE coding schemes may be reused to accomplish the task of achieving lower code rates, rather than designing and introducing new coding schemes. Accordingly, various embodiments directed to methods and devices that facilitate achieving lower code rates using turbo encoders and turbo coding schemes are disclosed.

Figure 4:
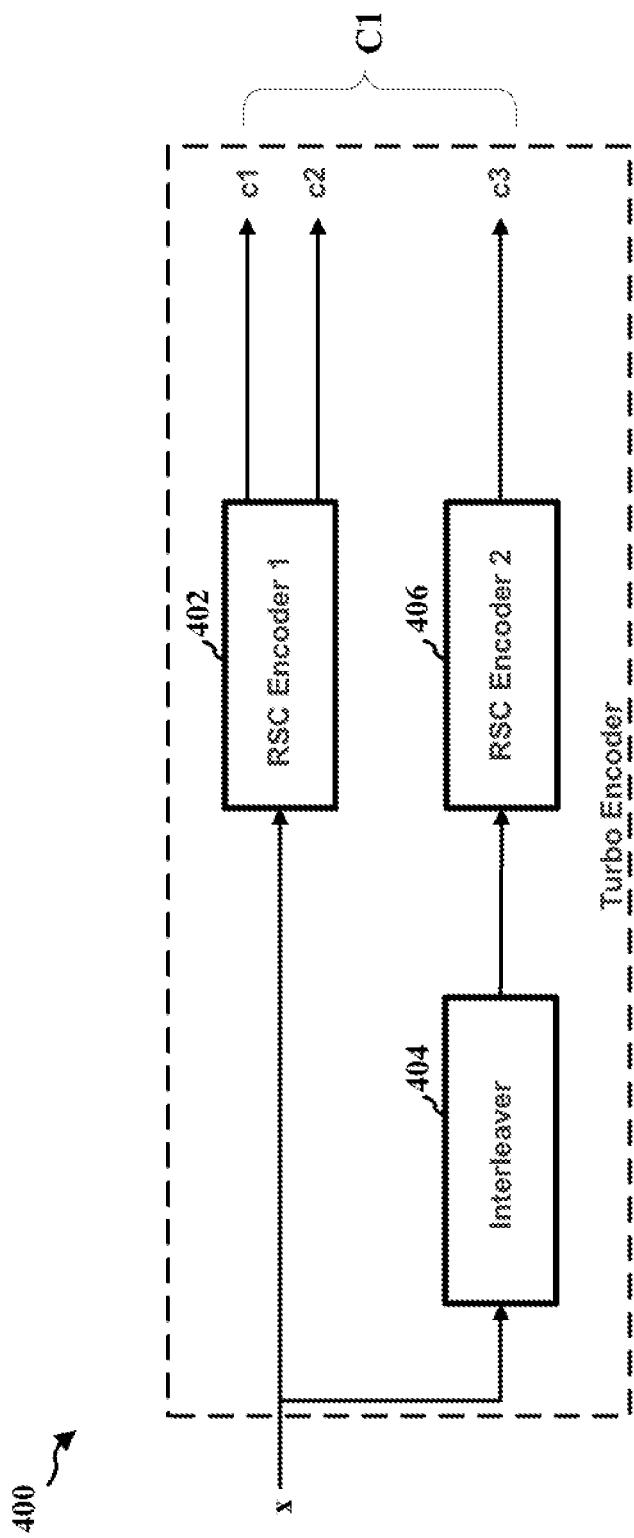
FIG. 4 illustrates a turbo encoder which may be used in some configurations.

FIG. 4 illustrates a turbo encoder 400. As illustrated, the turbo encoder 400 includes a first RSC encoder 402, a second RSC encoder 406 and an interleave 404 arranged in the illustrated manner. The first and the second RSC encoders 402, 406 are used in parallel branches as shown. In FIG. 4, "x" represents the input to the turbo encoder 400 which may be a stream of data bits (e.g., a bit stream). For simplicity, x may be considered to be a single bit for example. The output of the turbo encoder is illustrated as $c_1$, $c_2$, and $c_3$, where $c_1$ may be the same as x (because the turbo encoder is a systematic coder) while $c_2$ and $c_3$ are parity bits associated with "x". The coded bits $c_1$, $c_2$, and $c_3$ together may be referred to as a codeword (e.g., C1, where C1={$c_1$, c2, c3}) which is the output of the turbo encoder 400. The code rate of the turbo encoder 400 is 1/3. In general, if the code rate for a given encoder is k/n, for every k bits of useful information (e.g., input), the encoder generates a total of n bits (e.g., as output). Out of the total number of bits, n-k are redundant.

One way to reduce the coding rate of an encoder, such as the turbo encoder 400, may involve adding more parallel branches (of encoders). While adding more parallel branches may help in achieving a lower coding rate, however such an approach at least requires a hardware change which may not be desirable. Moreover, another level of complication is added with such an approach as to how should additional interleavers be designed/chosen to properly increase the weights of the codewords. This increases the overall complexity in implementation since the additional interleavers need to be carefully selected, or designed such that the weight of the output codewords increases. Thus, rather than adding more branches, a better alternative and more effective approach is described below with regard to FIG. 5 that facilitates achieving lower code rates without adding complexity.

Figure 5:
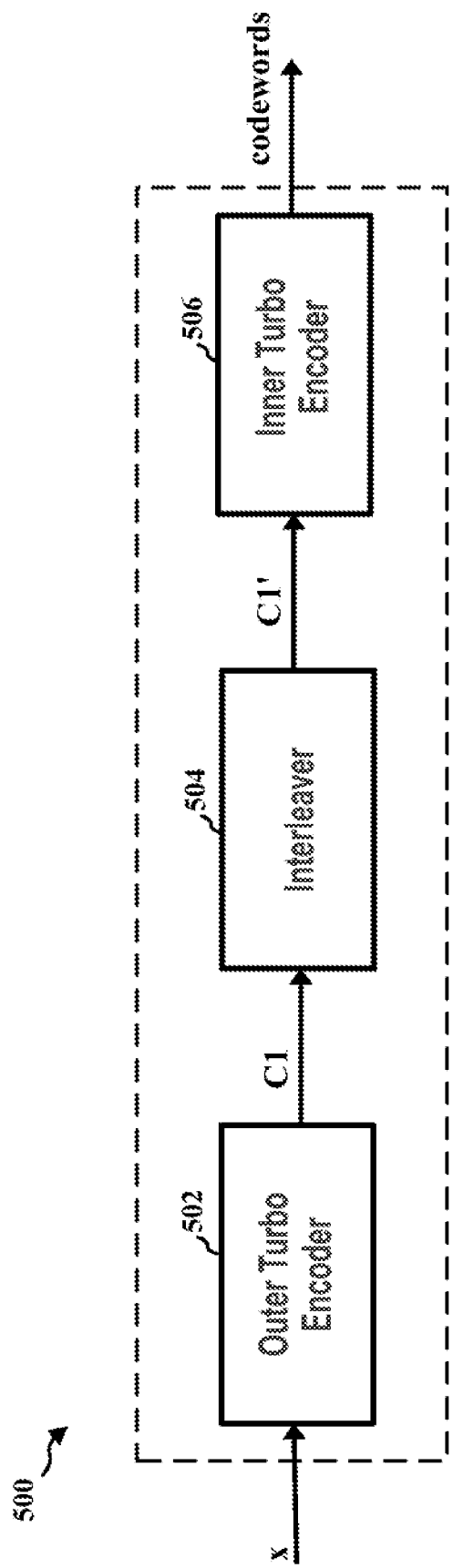
FIG. 5 illustrates a block diagram of an example super encoder implemented in accordance with the features of some configurations.

FIG. 5 illustrates a block diagram of an example super encoder 500, implemented in accordance with the features of some configurations. The example super encoder 500 may be used in a variety of communications devices such as base stations, access points, modems, UEs, etc., which transmit coded data. The super encoder 500 presents a simple yet effective approach to achieve lower code rates, e.g., lower than mother code rate of 1/3 for example. The exemplary super encoder 500 includes a first turbo encoder 502, an interleaver 504, and a second turbo encoder 506. Each of the turbo encoders 502, 506 may be the same as or similar to the turbo encoder 400 shown in FIG. 4, that is, each turbo encoder may include two parallel RSC encoders and an interleaver as shown in the turbo encoder 400.

As illustrated, the two turbo encoders 502 and 506 of the example super encoder 500 are arranged in series in accordance with an aspect. The exemplary series combination of the turbo encoders 502 and 506, with the interleaver 504 in between, outputs serially concatenated turbo codes. The first turbo encoder 502 is also referred to as the outer turbo encoder and may have a code rate of 1/N in some configurations. The second turbo encoder 506 is also referred to as the inner turbo encoder and may have a code rate of 1/M in some configurations, where M and N are both positive integers. Continuing with the same example and notations considered above with regard to FIG. 4, let "x" be the input to the outer turbo encoder 502 (e.g., input to the super coder 500). The outer turbo encoder 502 produces the output codeword C1={c1, c2, c3}. The output C1 of the outer turbo encoder 502 is provided as an input to the interleaver 504. The interleaver 504, used between the outer and inner turbo encoders 502, 506 respectively, serves to scramble the received sequence of bits in C1. In an aspect, by using the interleaver 504 in the illustrated manner, generation of repeated bits is avoided. The output of the interleaver 504, which is represented as C1', is fed to the inner turbo encoder 506. The resulting codeword (e.g., also sometimes referred to as the concatenated code), generated by the inner turbo encoder 506, forms the output of the super encoder 500. In some configurations, M equals N. In one particular configuration, M=N=3. In such a configuration, the super encoder has an overall resultant code rate of 1/3*1/3=1/9.

In addition to achieving a lower code rate, e.g., code rate of 1/9 in the case where the code rate of each of the outer and inner turbo encoders is 1/3, another advantage of the proposed methods and apparatus is that the overall hamming distance (minimum weight) of the concatenated code may be increased. For example, if d1 is the distance corresponding to the outer encoder 502, and d2 is the distance corresponding to the inner encoder 506, then in accordance with the features of the proposed methods, the distance of the super encoder is D≥d1*d2. Thus, it should be appreciated that in addition to achieving an overall lower code rate, the minimum weight of the resulting concatenated code is increased. Increasing the weight of codewords is desired because an increased minimum weight increases the distance (e.g., hamming distance) between the codewords. As may be appreciated by those skilled in the art, greater the hamming distance between the codewords, the better the codewords are, and it is easier to isolate noise on a receiver end when decoding such codewords.

In accordance with an aspect, to decode the super-code, i.e., the concatenated code such as produced by the super encoder 500, a receiver may use a decoder that decodes the inner-code first, and then decodes the outer-code. Since both the inner and outer codes are turbo codes (generated by the inner and outer coders respectively), for decoding the concatenated code, two serially concatenated turbo decoders may be used in some configurations. Such a super decoder including serially concatenated turbo decoders is illustrated in FIG. 6 and discussed below.

Figure 6:
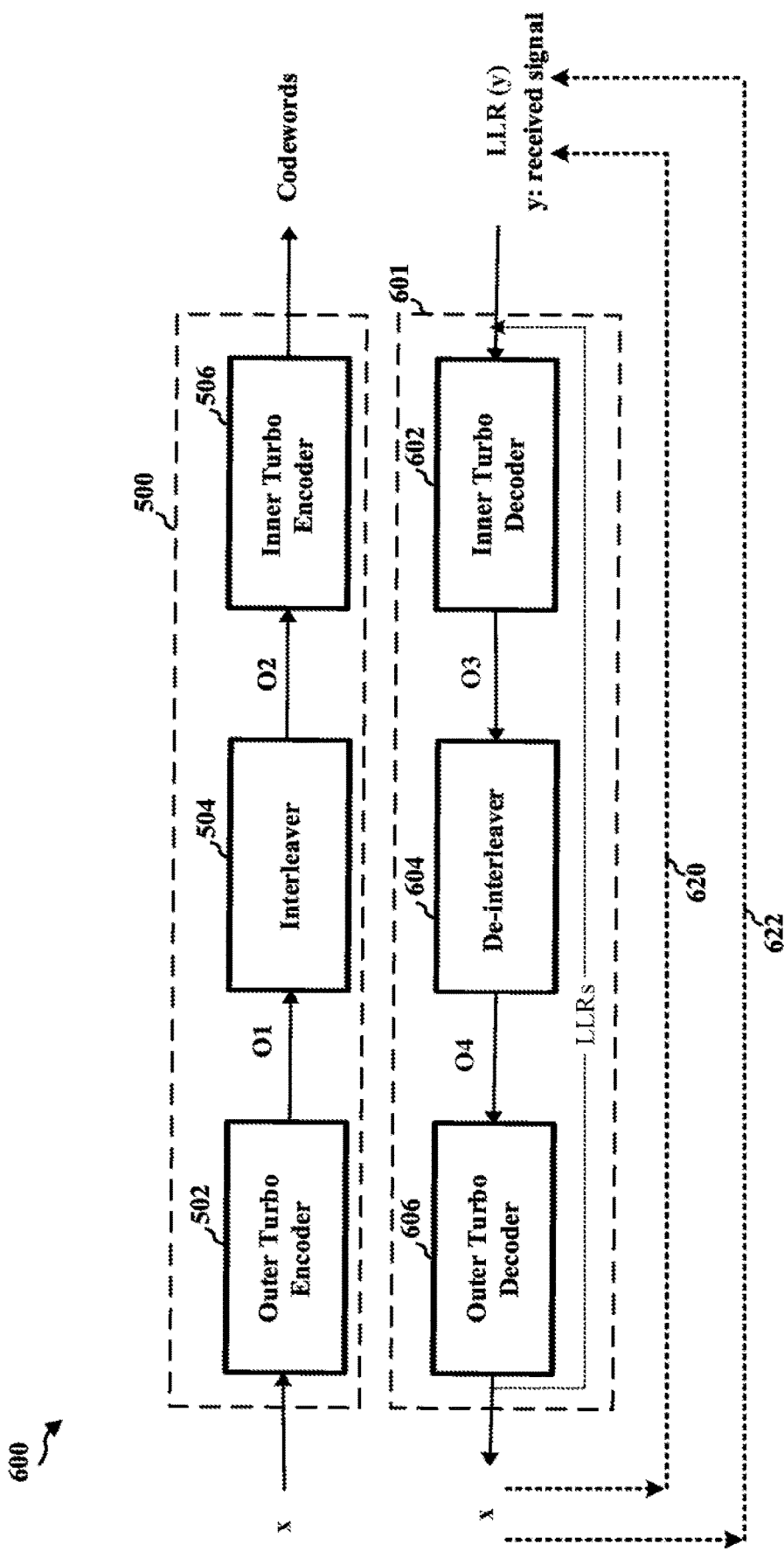
FIG. 6 illustrates a block diagram of an example super encoder and an example decoder, in accordance with one configuration.

FIG. 6 is a drawing 600 illustrating a block diagram of the exemplary super encoder 500 and an exemplary super decoder 601. Drawing 600 further illustrates an example of iterative decoding using serially concatenated turbo decoders of the exemplary super decoder 601. The components/elements as well as the functioning of the super decoder 500 has been discussed in detail with respect to FIG. 5 and thus the encoding related discussion will not be repeated. In the illustrated example configuration of FIG. 6, the super decoder 601 includes an inner turbo decoder 602, a de-interleaver 604 and an outer turbo decoder 606. In accordance with an aspect, the super decoder 601 may receive a concatenated code and decodes the inner-code first, and then decodes the outer-code. The received signal may include a sequence of modulated symbols, e.g., representing outer turbo encoded, interleaved, inner turbo encoded content, e.g., the super coded content. The content may include source data portion and a cyclic redundancy check (CRC) portion. In an aspect, the inner turbo decoder 602 may generate a first decoded instance of the received data by decoding an inner turbo encoded portion of the received data. The de-interleaver 604 may receive, as an input, the output of the inner turbo decoder 602 to perform the de-interleaving operation. The output of the de-interleaver 604 may be then fed to the outer turbo decoder 606 which may decode an outer turbo encoded portion of the received data. The decoded data is obtained as the output of the outer turbo decoder 606. If further decoding iterations are not desired, the decoded data output thus obtained from the outer turbo decoder 606 may be treated as the result of the decoding operation.

In various configurations, logarithmic-likelihood ratios (LLRs) may be used in the decoding of the received codewords (including the inner and outer codes) to recover the transmitted data. In one configuration, the decoder 601 may include two serially concatenated Bahl, Cocke, Jelinek and Raviv (BCJR) decoders which iteratively decode the inner/outer codes. It may be noted that the number of iterations may change the decoding delay. For example, increasing the number of iterations in decoding may provide better decoding results and improve decoding performance, however increasing the number of iterations also increases the decoding delay. As a result, to determine how many iterations are desired, the performance gain versus decoding delay may be considered jointly to determine an appropriate tradeoff.

From an implementation perspective, besides the complexity issue, the super decoder 601 may pass the LLRs (e.g., corresponding to a received coded bit sequence) between the inner and outer decoders 602 and 606. In an aspect, if multiple iterations are not desired/performed, the iteration may just be performed once. Furthermore, in some configurations, a CRC check/mapping stage(s) may be utilized once the decoding algorithm converges, e.g., as a result of using iterative decoding in some configurations. In some other systems which use a single turbo decoder, the CRC check/mapping stages may be available at the output of the only decoder.

In accordance with an aspect, the super decoder 601 may pass the LLRs, e.g., corresponding to a given set of input bits, between the inner and outer decoders 602 and 606, for iterative decoding. For a received signal (y), the inner turbo decoder 602 may be provided LLR(y) as an input. The received signal may include a sequence of modulated symbols, e.g., corresponding to the received outer turbo encoded, interleaved, inner turbo encoded content. LLR(y) may include the log-likelihood ratios (LLRs) corresponding to the received input signal (y), e.g., a sequence where each entry of the sequence represents a probability that a given element is a 0 or 1. For iterative decoding, e.g., if iterations are allowed across the two decoders 602 and 606, the output of the outer decoder 606 may be sent to the inner decoder 602 as an input.

With reference to FIG. 6, consider an example of iterative decoding using the serially concatenated turbo decoders 602, 606. The input to the inner turbo decoder 602 may be provided as the LLR(y) which is a sequence of LLRs as discussed above. The inner turbo decoder 602 may be configured to update the input LLRs. The output of the inner turbo decoder 602 is shown as O3 which is a sequence of LLRs that are provided to the de-interleaver 604. The de-interleaver 604 outputs O4, which is again a sequence of LLRs, that are provided as an input to the outer turbo decoder 606. The outer turbo decoder 606 generates updated O4 (updated LLRs). If no iterations are further desired, the output of the outer turbo decoder 606 (e.g., updated sequence of LLRs) is mapped to 0 and 1s, and this becomes the decoded output from the decoder 601. However, if the decoding scheme is iterative (e.g., more iterations are desired), then the output of outer turbo decoder 606 (e.g., in the form of updated LLRs) is passed on as an input to the inner turbo decoder 602. In the second round/iteration 620, the decoding is performed using the updated LLRs which are provided as input to the inner turbo decoder 602 and the process may go on if desired. Thus, in each subsequent iteration 622, updated LLRs may be used in the decoding stages. Thus in this manner, iterative decoding may be performed (when desired) by exchanging the LLRs between the inner and outer decoders 602 and 606. In some configurations, the steps discussed above in the example may be repeated until the decoding algorithm converges. In some configurations, the CRC check/mapping stages may be utilized once the decoding algorithm converges and no more decoding iterations are being performed.

Figure 7:
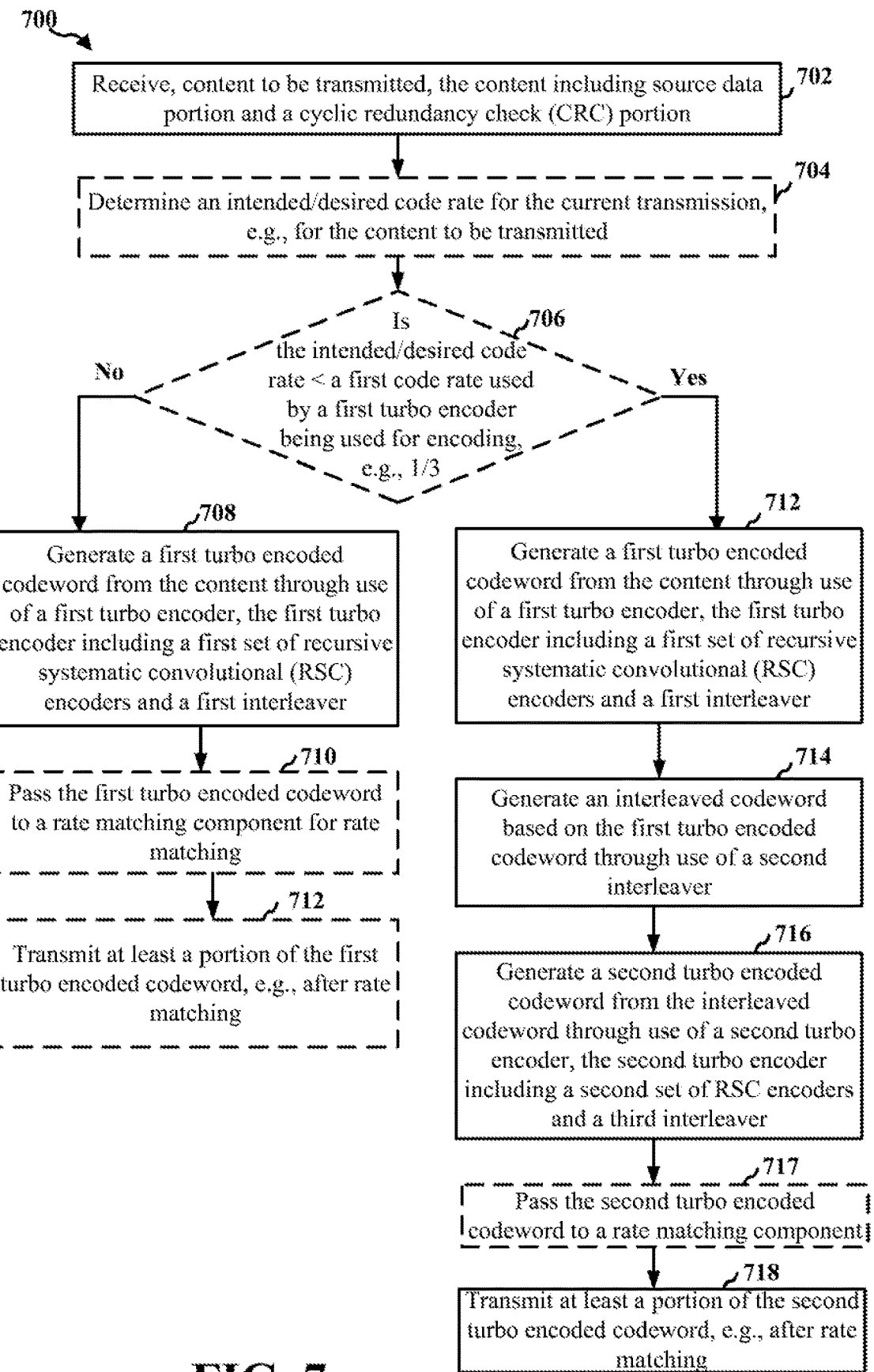
FIG. 7 is a flowchart of an example method of wireless communication, in accordance with an example embodiment.

FIG. 7 is a flowchart 700 of an exemplary method of wireless communication, in accordance with an exemplary embodiment. The method may be performed by an apparatus, e.g., communication device, including the example super encoder as disclosed herein, and/or by elements of an exemplary transmit/receive chain including, e.g., the super encoder disclosed herein. Such a transmit chain may be used in a variety of communication devices such as base stations, UEs, access points, modems etc. Some of the operations may be optional as represented by dashed/broken lines. At 702, content to be transmitted is received, e.g., at the super encoder 500. For example, the content to be transmitted may be received from a transmit data buffer (of a device that employs the super encoder) where generated content to be transmitted is stored prior to encoding and transmission. In another configuration, the content to be transmitted may be received at the super encoder from an external device. The content may include source data portion and a cyclic redundancy check (CRC) portion. For example with reference to FIG. 5, the first (outer) turbo encoder 502 of the super encoder 500 may receive the input data to be transmitted as discussed above.

At 704, a desired/intended coding rate for the current transmission, e.g., for the content to be transmitted, is determined. The desired/intended code rate may be determined based on a number of factors, e.g., such as allowed transmission rate, desired transmission rate, allocated transmission resources, channel conditions etc. Once the parameters/factors that affect the desired/intended code rate are determined, the desired/intended code rate may be determined based on the above parameters. At 706, it is determined whether the intended/desired code rate is less than a first code rate of a first turbo encoder being used for encoding the content, e.g., the outer turbo encoder 506 of the super coder 500. In some configurations, if at 706 the intended/desired code rate is determined to be not less than the first code rate (e.g., intended code rate ≥first code rate), then operation proceeds to 708.

At 708 a first turbo encoded codeword is generated from the content through use of the first turbo encoder. The first turbo encoder may include a first set of RSC encoders (e.g., such as the two RSC encoders 402 and 406) and a first interleaver (e.g., interleaver 404). For example, again referring to FIG. 5, the first turbo encoder may be the outer turbo encoder 502 which may be configured to generate the first turbo encoded codeword from the received content. In some configurations, the first turbo encoder encodes the content at a first code rate of 1/N to produce the first turbo encoded codeword, where N is a positive integer. In one particular configuration N=3. Next at 710, the first turbo encoded codeword from the first encoder 502 is passed to a rate-matching component which performs rate matching processing. One of the main functions of the rate-matching component is to extract the set of bits to be transmitted within a given TTI, e.g., sTTI. The rate-matching for turbo coded codewords may be defined for each code block. The output of rate matching component is set of coded bits of the first turbo encoded codeword that are extracted for transmission. After the processing by the rate-matching component, at 712 at least a portion of the first turbo encoded codeword is transmitted, e.g., over the air and/or over a wired channel. The portion of the first turbo encoded codeword that is transmitted comprises the output from the rate matching component. In some configurations, the portion of the first turbo encoded codeword that is transmitted may include the full set of coded bits of the first turbo encoded codeword.

On the other hand, if at 706 the intended/desired code rate is determined to be less than the first code rate (e.g., intended code rate <first code rate), then the operation proceeds to 712. In accordance with an aspect, at 712 a first turbo encoded codeword is generated from the content through use of the first turbo encoder. The first turbo encoder may include a first set of RSC encoders and a first interleaver. As discussed earlier, the first turbo encoder may be the outer turbo encoder 502 (of the super coder 500 of FIG. 5) which may be configured to generate the first turbo encoded codeword from the received content. In some configurations the first turbo encoder encodes the content at a first code rate of 1/N to produce the first turbo encoded codeword, where N is a positive integer. Next at 714, the first turbo encoded codeword from the first encoder is fed to an interleaver that generates an interleaved codeword based on the first turbo encoded codeword. For example, referring to FIG. 5, the output of the outer encoder 502 is provided to the interleaver 504, where the interleaver 504 may be configured to generate an interleaved codeword based on the first turbo encoded codeword. At 716, a second turbo encoded codeword is generated from the interleaved codeword through use of a second turbo encoder, e.g., the inner turbo encoder 506 of FIG. 5. In some configurations, the second turbo encoder includes a second set of RSC encoders and a third interleaver. Thus, in various configurations, upon a determination that the intended code rate is less than the first code rate, the operation may be controlled to proceed with generation of the interleaved codeword and the second turbo encoded codeword. In some configurations, the second turbo encoder encodes the interleaved codeword (i.e., output of the second interleaver 504) at a second code rate of 1/M to produce the second turbo encoded codeword, where M is a positive integer. Thus by using the turbo encoders in series in accordance with the disclosed features, an overall code rate of 1/(M*N) is achieved which is lower than the first code rate (1/N) and the second code rate (1/M).

Next at 717, the second turbo encoded codeword from the second turbo encoder 506 is passed to a rate-matching component which performs rate matching processing. After the processing is performed by the rate-matching component, at 718 at least a portion of the second turbo encoded codeword is transmitted, e.g., over the air and/or over a wired channel. The portion of the second turbo encoded codeword that is transmitted is the output of the rate matching component which may select (as part of the rate matching operation) a set of coded bits of the second turbo encoded codeword for transmission. The set of coded bits of the second turbo encoded codeword may comprise a subset/portion of the second turbo encoded codeword or the full second turbo encoded codeword.

Figure 8:
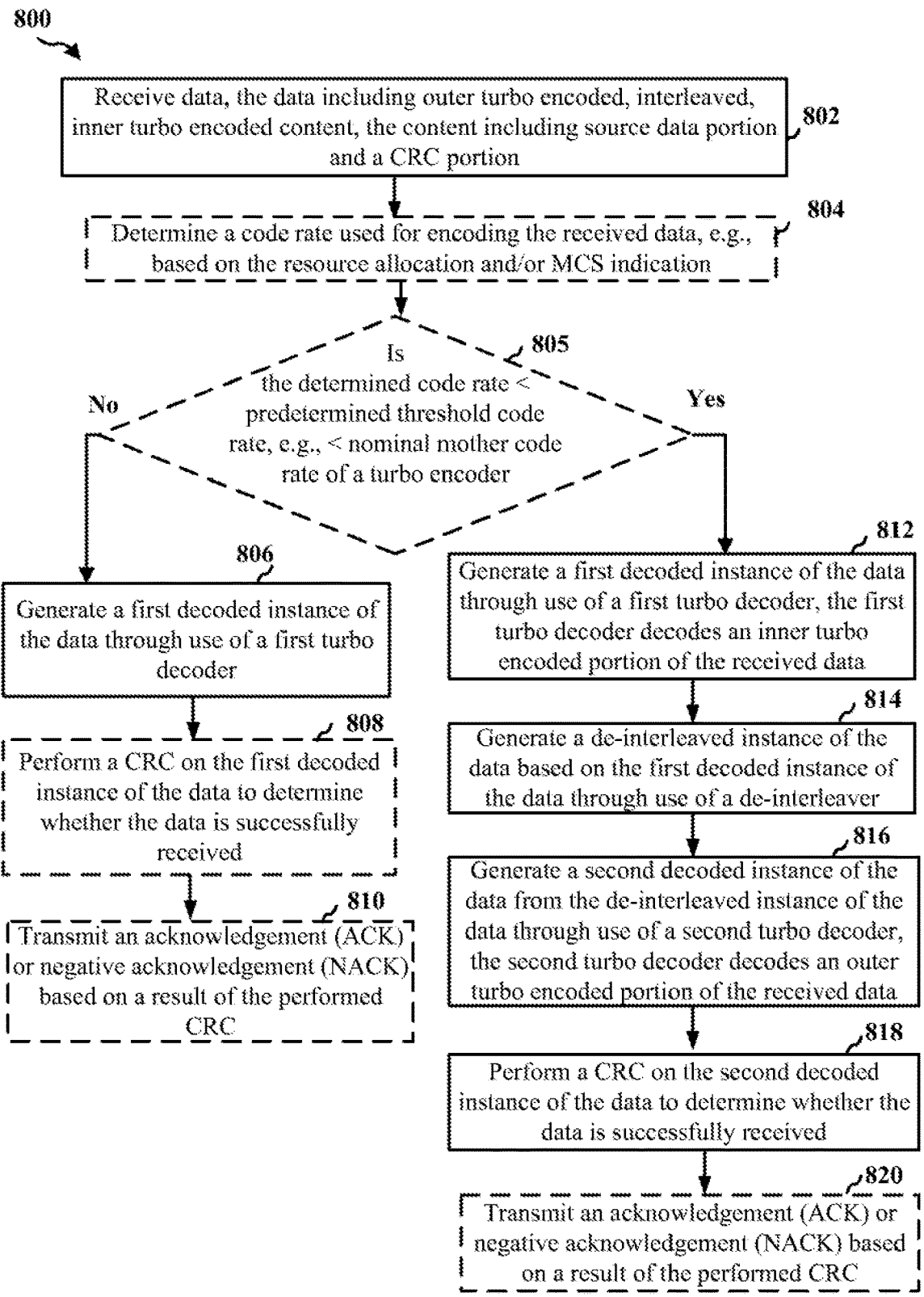
FIG. 8 is a flowchart of another example method of wireless communication, in accordance with another exemplary embodiment.

FIG. 8 is a flowchart 800 of another exemplary method of wireless communication. The method may be performed by an apparatus such as a UE, base station and/or another communication device that uses a decoder of the type disclosed herein, e.g., such as the super decoder 601. Some of the operations may be optional as represented by dashed/broken lines. At 802, the apparatus may receive data, e.g., a data stream including codewords from another device, e.g., a base station or a UE, modem or another device that transmitted encoded content to the apparatus. The data may include outer turbo encoded, interleaved, inner turbo encoded content, the content including source data portion and a CRC portion. At 804, the apparatus may determine a code rate used for encoding the received data. The determination may be based on the information, e.g., such as resource block allocations and/or modulation and coding scheme (MCS) indication, communicated by the transmitting device. At 805 the apparatus determines if the determined code rate is less than a predetermined threshold code rate, e.g., nominal mother code rate of a turbo encoder (e.g., the first turbo encoder 502) used by the transmitting device for encoding. The information regarding the nominal mother code rate of the turbo encoder(s) used by the transmitting device is known to the apparatus prior to performing decoding operations in some configurations. In various configurations, based on the determination at 805, the apparatus selects an appropriate decoding scheme. For example, when the determined code rate is 1/3, the apparatus may simply decode using a single turbo decoder in the normal manner, otherwise when the determined code rate is <1/3, the apparatus determines that a serially concatenated codes need to be decoded and accordingly selects the exemplary super decoder for decoding.

Thus, when the determined code rate is not less than the predetermined threshold code rate, at 806 the apparatus may generate a first decoded instance of the data through use of a first turbo decoder, e.g., which may be the turbo decoder 602. At 808, the apparatus may perform a CRC on the first decoded instance of the data to determine whether the data is successfully received. In some configurations the first turbo decoder may perform multiple iterations before performing the CRC. At 810, the apparatus may transmit an acknowledgement (ACK) or negative acknowledgement (NACK) based on a result of the performed CRC, e.g., based on whether CRC indicates that the received data is successfully decoded or not. When decoding and recovery of the data is successful, an ACK may be transmitted, otherwise a NACK may be transmitted.

On the other hand, when the determined code rate is less than the predetermined threshold code rate, operation proceeds to 812. At 812, the apparatus may generate a first decoded instance of the data through use of a first turbo decoder. In various embodiments the first turbo decoder decodes an inner turbo encoded portion of the received data. For example, with reference to FIG. 6, the first turbo decoder may be the inner turbo decoder 602 that may decode the inner code of the received codeword in the manner discussed above with regard to FIG. 6.

Next, at 814, the apparatus may generate a de-interleaved instance of the data based on the first decoded instance of the data through use of a de-interleaver. At 816 the apparatus may generate a second decoded instance of the data from the de-interleaved instance of the data through use of a second turbo decoder. In some configurations, the second turbo decoder decodes an outer turbo encoded portion of the received data. For example, with reference to FIG. 6, the second turbo decoder may be the outer turbo decoder 606 that may decode the outer code of the received codeword.

In some configurations, the decoding operation may be performed iteratively for improved decoding results. In an aspect, a number of iterations to be performed may be determined based on a decoding performance gain from the number of iterations and a decoding delay resulting from the number of iterations. In some such configurations, multiple iterations may be performed across the first and second turbo decoders until the decoding converges. In one such configuration, the apparatus may be further configured to generate a second iteration of the first decoded instance, based on the second decoded instance generated by the second turbo decoder, through use of the first turbo decoder. The apparatus may be further configured to generate a second iteration of the de-interleaved instance of the data, based on the second iteration of the first decoded instance of the data, through use of the de-interleaver. The apparatus may be further configured to generate a second iteration of the second decoded instance of the data from the second iteration of the de-interleaved instance of the data through use of the second turbo decoder. For example, the apparatus may include the decoder 601 of FIG. 6 for performing decoding operation and the decoder 601 may pass the LLRs, between the inner and outer decoders 602 and 606 for iterative decoding as discussed in detail in connection with FIG. 6. In some configurations, a number of iterations of the first decoded instance and the second decoding instance to be generated is determined as a function of a decoding performance gain from the number of iterations and a decoding delay resulting from the number of iterations.

At 818, the apparatus may perform a CRC on the second decoded instance of the data to determine whether the data is successfully received. In some configurations the CRC check/mapping may be performed when the decoding converges. At 820, the apparatus may transmit an acknowledgement (ACK) or negative acknowledgement (NACK) based on a result of the performed CRC. For example, in some configurations, if the received data is successfully decoded and recovered, then an ACK may be transmitted, otherwise a NACK may be transmitted.

Figure 9:
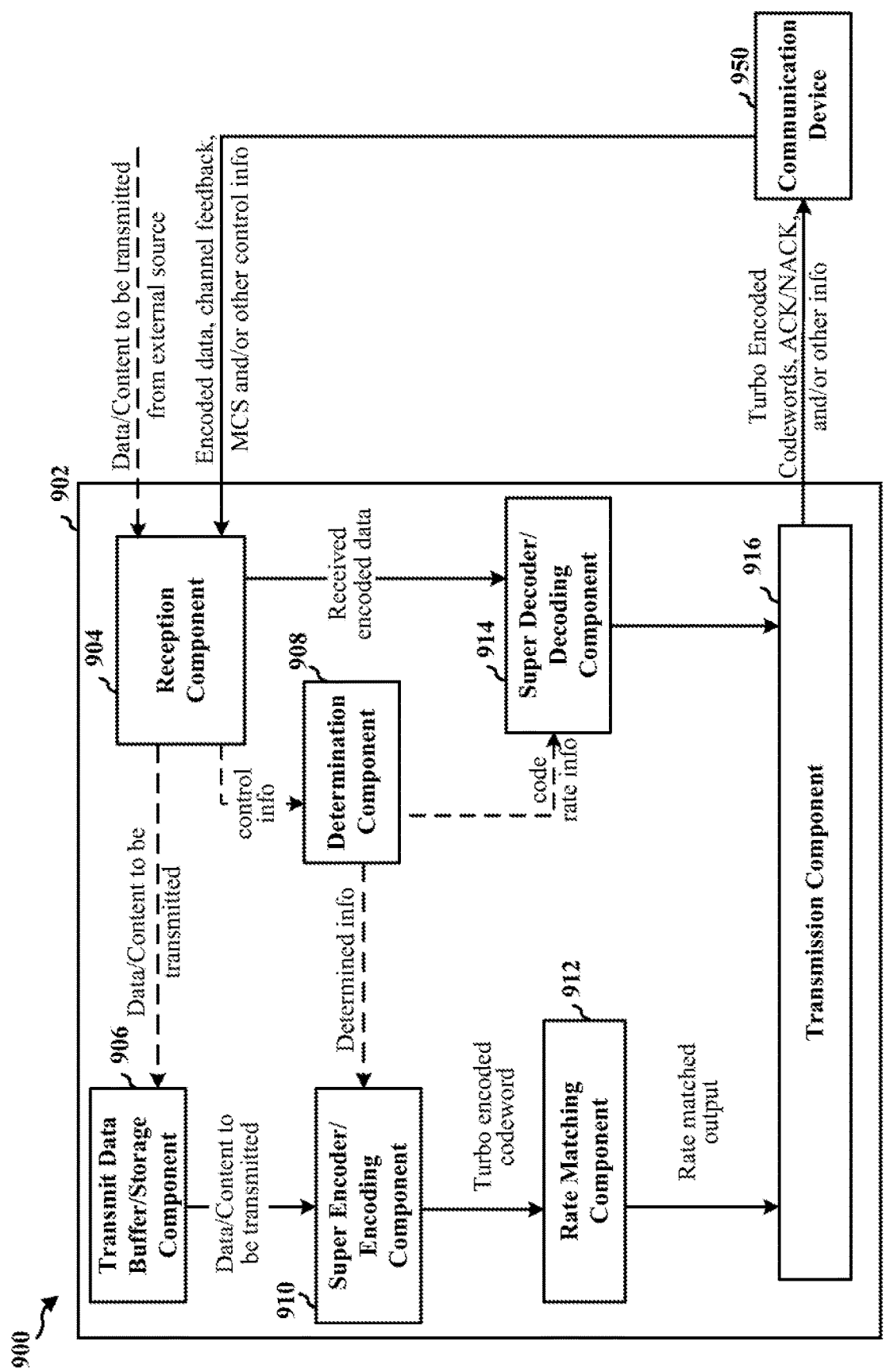
FIG. 9 is a conceptual data flow diagram illustrating the data flow between different means/components in an exemplary apparatus.

FIG. 9 is a conceptual data flow diagram 900 illustrating the data flow between different means/components in an example apparatus 902. The apparatus 902 may be a device (e.g., such as base station 102/180/310, UE 104/350, a modem, or another communication device) that may employ the super encoder and/or the super decoder described supra. The apparatus 902 may include a reception component 904, a transmit data buffer/storage component 906, a determination component 908, a super encoder/encoding component 910, a rate matching component 912, a super decoder/decoding component 914, and a transmission component 916. In the illustrated configuration, the apparatus 902 includes both a super encoder and a super decoder. However, in some other configurations the apparatus 902 may include one of the super encoder or the super decoder.

The reception component 904 may be configured to receive messages and/or other information from other devices including, e.g., communication device 950 which may be a base station, UE, modem, or another such device. The communication device 950 may also include the super encoder 500 and/or decoder 601 described supra. The signals/information received by the reception component 904 may be provided to one or more components of the apparatus 902 for further processing and use in performing various operations in accordance with the methods discussed supra including the method of flowcharts 700 and 800. In some configurations, the reception component 904 may receive (e.g., from another input device or external source) content to be transmitted which may then be stored in the transmit data buffer 906 prior to being supplied to the super encoder for encoding. The content may include source data portion and a CRC portion. In some other configurations, the content to be transmitted may be generated by the apparatus 902 and stored in the transmit data buffer 906 prior to being supplied to the super encoder for encoding in accordance with the proposed methods described herein. The reception component 904 may be further configured to receive data, e.g., from the communication device 950, where the data may include encoded content, e.g., outer turbo encoded, interleaved, inner turbo encoded content. The content may include source data portion and a CRC portion. The received encoded data may be provided from the reception component 904 to the super decoder 914 for decoding in accordance with the proposed methods described herein.

The super encoder 910 may be the super encoder 500 shown FIGS. 5-6, and may perform the same functions discussed earlier with respect to super encoder 500. For example, the super encoder 910 may include the first (outer) turbo encoder 502, the interleaver 504, and the second (inner) turbo encoder 506. The first (outer) turbo encoder 502 may have a first code rate of 1/N and the second (inner) turbo encoder 506 may have a second code rate of 1/M in some configurations, where M and N are both positive integers. The determination component 908 may be configured to determine whether an intended code rate is less than the first code rate (e.g., nominal mother code rate of the first turbo encoder 502), and provide the result of determination to the super encoder 910. The determination may be performed based on number of factors/parameters, e.g., such as allowed transmission rate, desired transmission rate, allocated transmission resources, channel conditions etc. Some such factors/parameters may be preconfigured and/or determined by the determination component 908 based on configuration/control information received from the communication device 950. The determination component 908 may provide the result of the determination to the super encoder 910. When the determined information from the determination component 908 indicates that the intended/desired code rate is equal to or greater than the first code rate of the first turbo encoder 502 (e.g., intended code rate ≥first code rate), the super encoder 910 may generate, using the first turbo encoder 502, a first turbo encoded codeword from the content to be transmitted, and in this case the first turbo encoded codeword forms the output of the super encoder 910. On the other hand, when the determined information from the determination component 908 indicates that the intended/desired code rate is less than the first code rate of the first turbo encoder 502, the super encoder 910 may first generate a first turbo encoded codeword from the content through use of the first turbo encoder, then the first turbo encoded codeword from the first encoder is fed to the interleaver 505 that generates an interleaved codeword based on the first turbo encoded codeword, and finally a second turbo encoded codeword is generated from the interleaved codeword through use of the second turbo encoder 506. In the second case, the second turbo encoded codeword becomes the output of the super encoder 910. Thus, depending on the whether the desired code rate is less than the mother code rate of the first encoder 502 of the super encoder 910, the super encoder 910 may output either the first turbo encoded codeword or the second turbo encoded codeword (e.g., shown as output turbo encoded codeword in FIG. 9). The turbo encoded codeword may then be supplied to the rate matching component 912.

The rate matching component 912 may be configured to perform rate matching operation on the output turbo encoded codeword received from the super encoder 910. The output from the rate matching component 912, e.g., rate matched output, is provided to the transmission component 916 for transmission. The rate matched output may comprise at least a portion of the turbo encoded codeword from the super encoder 910.

When the apparatus 902 receives (via the reception component 904) encoded content from the communication device 950, the received content may be provided to the super decoder 914 for decoding. The super decoder 914 may be the super decoder 601 shown FIG. 6, and may perform the same functions discussed earlier with respect to super decoder 601. For example, the super decoder 910 may include the inner turbo decoder 602, the de-interleaver 604, and the outer turbo decoder 606, and may be configured to perform decoding in accordance with the decoding process illustrated in the flowchart 800. In the case when decoding of received data needs to be performed, the determination component 908 may determine a code rate that may have been used for encoding the received data. Such determination may be based on control information, e.g., resource allocation and/or MCS indication, received from the communication device 950 that transmitted the encoded data. The determination component 908 may be further configured to determine whether the determined code rate is less than a predetermined threshold code rate, e.g., nominal mother code rate of a turbo encoder (e.g., the first turbo encoder 502) used by the transmitting device (e.g., communication device 950) for encoding. The result of determination (e.g., information indicating whether code rate is less than threshold code rate) is then passed on to the super decoder 914, and the super decoder 914 may decide how to perform decoding based on the determined code rate.

For example, when the determined code rate is not less than the nominal mother code rate (e.g., ~1/3) of a turbo encoder (e.g., the first turbo encoder 502 that may also be used by the transmitting device 950 for encoding), the super decoder 914 may decode the encoded content using a single turbo decoder of the super decoder 914. When the determined code rate is less than the threshold code rate (e.g., <1/3), the super decoder 914 may understand that serially concatenated codes need to be decoded and accordingly may perform decoding using the two turbo decoders of the super decoder 914. In this case, the super decoder 914 may first generate a first decoded instance of the data through use of the first turbo decoder 602 (which may decode the inner code of the codeword), then generate a de-interleaved instance of the data based on the first decoded instance of the data through use of the de-interleaver 604, and generate a second decoded instance of the data from the de-interleaved instance of the data through use of the second turbo decoder 606 (which may decode the outer code of the codeword).

In some configuration, the super decoder 914 may be configured to perform iterative decoding (e.g., perform multiple iterations) in the manner discussed above in connection with FIG. 6. The number of iterations to be performed may be determined (e.g., by the super decoder 914 or controller/processor of apparatus 902) based on a decoding performance gain from the number of iterations and a decoding delay resulting from the number of iterations. In some such configurations, multiple iterations may be performed across the first and second turbo decoders 602, 606 of the until the decoding converges. In one such configuration, super decoder 914 may generate a second iteration of the first decoded instance, from the second decoded instance generated by the second turbo decoder 606, through use of the first turbo decoder 602. The super decoder 914 may further generate a second iteration of the de-interleaved instance of the data, based on the second iteration of the first decoded instance of the data, through use of the de-interleaver 604. Subsequently, the super decoder 914 may further generate a second iteration of the second decoded instance of the data from the second iteration of the de-interleaved instance of the data through use of the second turbo decoder 606. For example, the super decoder 914 may pass the LLRs, e.g., corresponding to bits of input data, between the inner and outer decoders 602 and 606 for iterative decoding as discussed in detail in connection with FIG. 6.

Once decoding operation is complete (e.g., when the decoding converges), a CRC operation may be performed on the decoded output data. In some configurations, the super decoder 914 may include a CRC component (not shown separately) for performing the CRC, or alternatively the CRC component may be external to the super decoder 914. In the apparatus 902, the CRC component may be considered to be a part of the super decoder 914. In the example case of a single iteration decoding of received encoded data which includes a serially concatenated code, the second decoded instance of the data (generated by the second turbo decoder 606 as discussed above) may be the decoding output. In such an example case, the super decoder 914 may perform (e.g., using the CRC component) a CRC on the second decoded instance of the data to determine whether the data is successfully received. In other cases where multiple iterations may be performed, the CRC may be performed on the final decoding output generated after multiple decoding iterations.

If the CRC is successful, the decoded output data may be stored and/or provided to other components of the apparatus for processing and/or use. If the CRC is unsuccessful, the apparatus 902 may request retransmission of the received content from the communication device 950. In some configurations, an indication of the result of CRC determination (decoding success/failure indication) is provided to the transmission component 916 Based on such indication, the transmission component 916 may be configured to generate and transmit an acknowledgement (ACK) or negative acknowledgement (NACK) to the communication device 950.

The transmission component 916 may be configured to transmit turbo encoded codewords, ACK/NACK feedback(s), and/or other information to one or more external devices, e.g., communication device 950. For example, in some configurations where the apparatus 902 has turbo encoded data for transmission, the transmission component 916 may be configured to transmit at least a portion of the turbo encoded codeword (after rate matching has been performed on the turbo encoded codeword produced by the super encoder) to the communication device 950. In one configuration, the transmission component 916 may be configured to transmit at least a portion of a first turbo encoded codeword, where the first turbo encoded codeword may be generated by a first turbo encoder, e.g., such as the first turbo encoder 502 of the super encoder 500. In one configuration, the transmission component 916 may be configured to transmit at least a portion of a second turbo encoded codeword, where the second turbo encoded codeword may be generated by a second turbo encoder, e.g., such as the second turbo encoder 506 of the super encoder 500.

In some configurations, where the apparatus 902 performs decoding on received encoded data, the transmission component 916 may be configured to transmit an acknowledgement (ACK) or negative acknowledgement (NACK) based on a result of the CRC operation discussed above in connection with the decoding operation. In one configuration, the transmission component 916 may be configured to generate and transmit an ACK when the received data is successfully decoded, and transmit a NACK when the decoding is unsuccessful.

Figure 10:
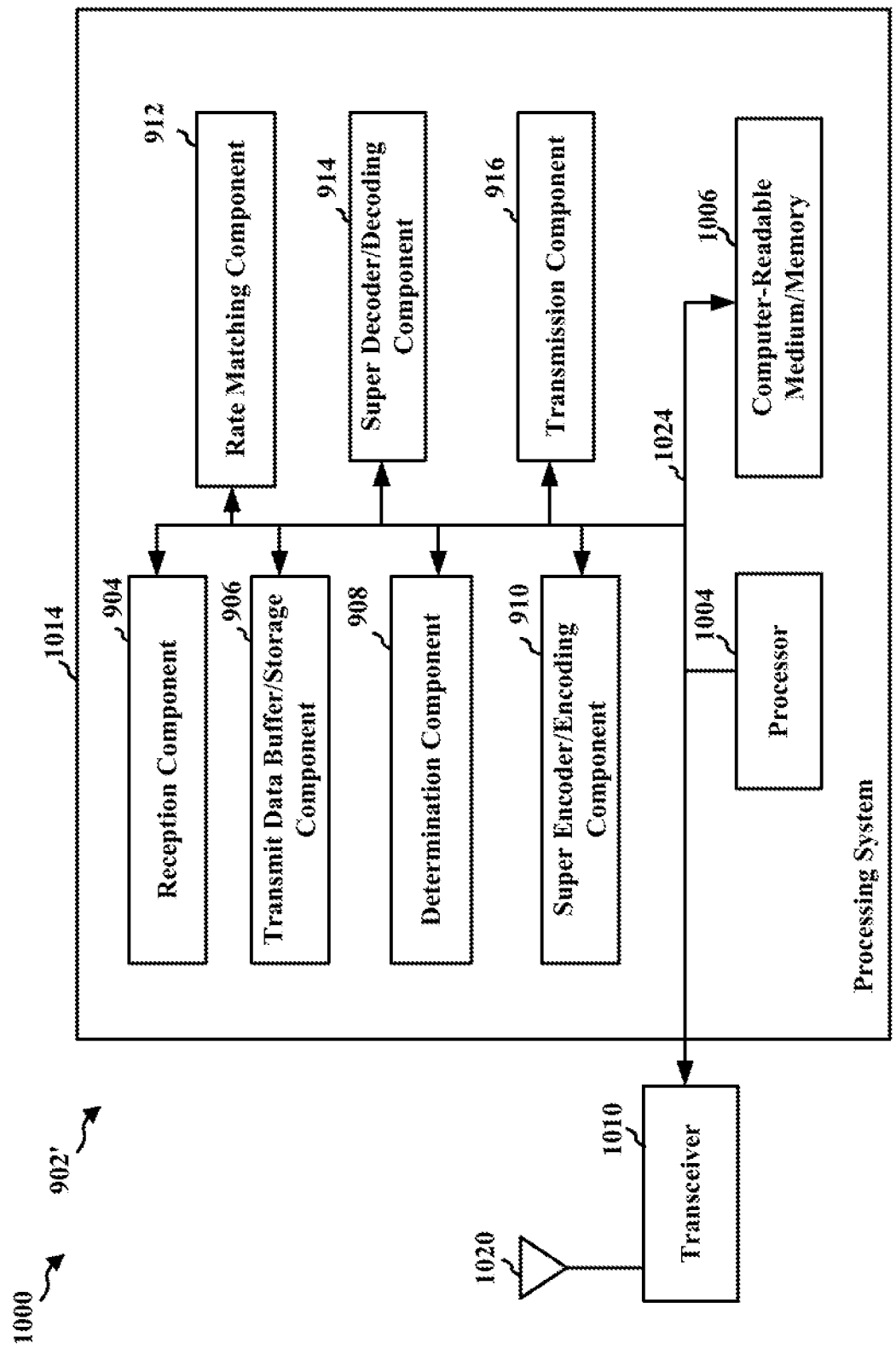
FIG. 10 is a diagram illustrating an example of a hardware implementation for an apparatus employing a processing system.

The apparatus may include additional components that perform each of the blocks of the algorithm in the aforementioned flowchart of FIG. 10. As such, each block in the aforementioned flowchart of FIG. 10 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

FIG. 10 is a diagram 1000 illustrating an example of a hardware implementation for an apparatus 902' employing a processing system 1014. The processing system 1010 may be implemented with a bus architecture, represented generally by the bus 1024. The bus 1024 may include any number of interconnecting buses and bridges depending on the specific application of the processing system 1014 and the overall design constraints. The bus 1024 links together various circuits including one or more processors and/or hardware components, represented by the processor 1004, the components 904, 906, 908, 910, 912, 914, 916 and the computer-readable medium/memory 1006. The bus 1024 may also link various other circuits such as timing sources, peripherals, voltage regulators, and power management circuits, which are well known in the art, and therefore, will not be described any further.

The processing system 1014 may be coupled to a transceiver 1010. The transceiver 1010 is coupled to one or more antennas 1020. The transceiver 1010 provides a means for communicating with various other apparatus over a transmission medium. The transceiver 1010 receives a signal from the one or more antennas 1020, extracts information from the received signal, and provides the extracted information to the processing system 1014, specifically the reception component 904. In addition, the transceiver 1010 receives information from the processing system 1014, specifically the transmission component 916, and based on the received information, generates a signal to be applied to the one or more antennas 1020. The processing system 1014 includes a processor 1004 coupled to a computer-readable medium/memory 1006. The processor 1004 is responsible for general processing, including the execution of software stored on the computer-readable medium/memory 1006. The software, when executed by the processor 1004, causes the processing system 1014 to perform the various functions described supra for any particular apparatus. The computer-readable medium/memory 1006 may also be used for storing data that is manipulated by the processor 1004 when executing software. The processing system 1014 further includes at least one of the components 904, 906, 908, 910, 912, 914, and 916. The components may be software components running in the processor 1004, resident/stored in the computer-readable medium/memory 1006, one or more hardware components coupled to the processor 1004, or some combination thereof.

In one configuration, the apparatus 902/902' for wireless communication may comprise means for receiving content to be transmitted, the content including source data portion and a CRC portion. The apparatus 902/902' may further comprise means for generating a first turbo encoded codeword from the content, where the means for generating the first turbo encoded codeword may include a first set of RSC encoders and a first interleaver. The apparatus 902/902' may further comprise means for generating an interleaved codeword based on the first turbo encoded codeword, and means for generating a second turbo encoded codeword from the interleaved codeword, the means for generating the second turbo encoded codeword may include a second set of RSC encoders and a second interleaver. The apparatus may further include means for transmitting at least a portion of the second turbo encoded codeword. In one configurations, the means for generating the first turbo encoded codeword and the means for generating the second turbo encoded codeword are in series with each other separated by the means for generating the interleaved codeword. In one configuration, the apparatus may further comprise means for determining whether an intended (e.g., desired) code rate for transmission of the content to be transmitted is less than the first code rate. In one configuration, when the intended code rate is determined to be not less than the first code rate, the means for determining may be configured to control the means for generating the first turbo encoded codeword to pass the first turbo encoded codeword to a rate-matching component.

In some configurations, the means for receiving is further configured to receive data including outer turbo encoded, interleaved, inner turbo encoded content, the content including source data portion and a CRC portion. In some such configurations, the apparatus 902/902' may further comprise means for generating a first decoded instance of the data, the means for generating the first decoded instance of the data decoding an inner turbo encoded portion of the received data. The apparatus 902/902' may further comprise means for generating a de-interleaved instance of the data based on the first decoded instance of the data. The apparatus 902/902' may further comprise means for generating a second decoded instance of the data from the de-interleaved instance of the data, the means for generating the second decoded instance of the data decoding an outer turbo encoded portion of the received data. In one configuration, the apparatus 902/902' may further comprise means for performing a CRC on the second decoded instance of the data to determine whether the data is successfully received. In one configuration, the means for transmitting is further configured to transmit an acknowledgement (ACK) or negative acknowledgement (NACK) based on a result of the performed CRC. In one configuration, the means for generating the first decoded instance is further configured to generate a second iteration of the first decoded instance, based on the second decoded instance generated by the second turbo decoder. In one configuration, the means for generating the de-interleaved instance is further configured to generate a second iteration of the de-interleaved instance of the data, based on the second iteration of the first decoded instance of the data. In one configuration, the means for generating the second decoded instance is further configured to generate a second iteration of the second decoded instance of the data from the second iteration of the de-interleaved instance of the data. In some configurations, the number of iterations of the first decoded instance and the second decoding instance to be generated is determined as a function of a decoding performance gain from the number of iterations and a decoding delay resulting from the number of iterations.

In one configuration, the processing system 1014 may be a component of the UE 350 and may include the memory 360 and/or at least one of the TX processor 368, the RX processor 356, and the controller/processor 359. The aforementioned means may be one or more of the aforementioned components of the apparatus 902 and/or the processing system 1014 of the apparatus 902' configured to perform the functions recited by the aforementioned means. As described supra, the processing system 1014 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

In another configuration, the processing system 1014 may be a component of the base station 310 and may include the memory 376 and/or at least one of the TX processor 316, the RX processor 370, and the controller/processor 375. As such, in such a configuration, the aforementioned means may be the TX Processor 316, the RX Processor 370, and the controller/processor 375 configured to perform the functions recited by the aforementioned means.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of wireless communications, comprising:
    receiving content to be transmitted, the content including source data portion and a cyclic redundancy check (CRC) portion;
    generating a first turbo encoded codeword from the content through use of a first turbo encoder, wherein the first turbo encoder is associated with a first code rate; and
    determining whether an intended code rate for the content to be transmitted is less than the first code rate based on at least one of an allocation of resources for transmission of the content, an indication of a modulation and coding scheme (MCS) received from another apparatus, or conditions of a channel on which to transmit the content;
    wherein when the intended code rate is determined to be less than the first code rate, the method further comprises:
        generating an interleaved codeword based on the first turbo encoded codeword through use of an interleaver;
        generating a second turbo encoded codeword from the interleaved codeword through use of a second turbo encoder; and
        transmitting at least a portion of the second turbo encoded codeword.

2. The method of claim 1, further comprising:
    pass the second turbo encoded codeword to a rate-matching component for rate matching, wherein the portion of the second turbo encoded codeword that is transmitted is an output of the rate matching component.

3. The method of claim 1, wherein first turbo encoder encodes the content at the first code rate of 1/N to produce the first turbo encoded codeword, N being a positive integer.

4. The method of claim 3, wherein the second turbo encoder encodes the interleaved codeword at a second code rate of 1/M to produce the second turbo encoded codeword, M being a positive integer, and resulting in an overall code rate for the second turbo encoded codeword of 1/(M*N).

5. The method of claim 1, wherein the first and second turbo encoders are in series with each other separated by the interleaver.

6. The method of claim 1, wherein when the intended code rate is not less than the first code rate, the method further comprises:
    passing the first turbo encoded codeword to a rate-matching component; and
    transmitting at least a portion of the first turbo encoded codeword.

7. The method of claim 6, wherein the portion of the first turbo encoded codeword is an output of the rate matching component.

8. The method of claim 1, wherein the first turbo encoder includes a first set of recursive systematic convolutional (RSC) encoders and a second interleaver, and wherein the second turbo encoder includes a second set of RSC encoders and a third interleaver.

9. An apparatus for wireless communications, comprising:
    a memory; and
    at least one processor coupled to the memory and configured to:
        receive content to be transmitted, the content including source data portion and a cyclic redundancy check (CRC) portion;
        generate a first turbo encoded codeword from the content through use of a first turbo encoder, wherein the first turbo encoder is associated with a first code rate; and
        determine whether an intended code rate for the content to be transmitted is less than the first code rate based on at least one of an allocation of resources for transmission of the content, an indication of a modulation and coding scheme (MCS) received from another apparatus, or conditions of a channel on which to transmit the content;
    wherein when the intended code rate is determined to be less than the first code rate, the at least one processor is further configured to:
        generate an interleaved codeword based on the first turbo encoded codeword through use of an interleaver;
        generate a second turbo encoded codeword from the interleaved codeword through use of a second turbo encoder; and
        transmit at least a portion of the second turbo encoded codeword.

10. The apparatus of claim 9, wherein the at least one processor is further configured to:
pass the second turbo encoded codeword to a rate-matching component for rate matching, wherein the portion of the second turbo encoded codeword that is transmitted is an output of the rate matching component.

11. The apparatus of claim 9, wherein first turbo encoder encodes the content at the first code rate of 1/N to produce the first turbo encoded codeword, N being a positive integer.

12. The apparatus of claim 9, wherein the second turbo encoder encodes the interleaved codeword at a second code rate of 1/M to produce the second turbo encoded codeword, M being a positive integer, and resulting in an overall code rate for the second turbo encoded codeword of 1/(M*N).

13. The apparatus of claim 9, wherein the first and second turbo encoders are in series with each other separated by the interleaver.

14. The apparatus of claim 9, wherein when the intended code rate is not less than the first code rate, the at least one processor is further configured to:
pass the first turbo encoded codeword to a rate-matching component; and
transmitting at least a portion of the first turbo encoded codeword.

15. The apparatus of claim 9, wherein the first turbo encoder includes a first set of recursive systematic convolutional (RSC) encoders and a second interleaver, and wherein the second turbo encoder includes a second set of RSC encoders and a third interleaver.

16. A method of wireless communications, comprising:
receiving data, the data including outer turbo encoded, interleaved, inner turbo encoded content, the content including source data portion and a cyclic redundancy check (CRC) portion;
generating a first decoded instance of the data through use of a first turbo decoder, the first turbo decoder decodes an inner turbo encoded portion of the received data;
generating a de-interleaved instance of the data based on the first decoded instance of the data through use of a de-interleaver;
generating a second decoded instance of the data from the de-interleaved instance of the data through use of a second turbo decoder, the second turbo decoder decodes an outer turbo encoded portion of the received data; and
performing a CRC on a final decoded instance of the data to determine whether the data is successfully received,
wherein the CRC unperformed on decoded instances of the data other than the final decoded instance of the data.

17. The method of claim 16, further comprising:
transmitting an acknowledgement (ACK) or negative acknowledgement (NACK) based on a result of the performed CRC.

18. The method of claim 16, wherein the ACK is transmitted when the performed CRC is successful indicating successful decoding of the data, and wherein the NACK is transmitted when the performed CRC fails.

19. The method of claim 16, wherein the first turbo decoder and the second turbo decoder each includes Bahl, Cocke, Jelinek and Raviv (BCJR) decoders.

20. The method of claim 16, wherein the first turbo decoder and second turbo decoder are in series with each other.

21. The method of claim 16, wherein the first decoded instance of the data is provided to the de-interleaver as logarithmic likelihood ratios (LLRs).

22. The method of claim 16, further comprising:
generating a third decoded instance of the data, based on the second decoded instance generated by the second turbo decoder, through use of the first turbo decoder;
generating a second de-interleaved instance of the data, based on the third decoded instance of the data, through use of the de-interleaver; and
generating a fourth decoded instance of the data from the second de-interleaved instance of the data through use of the second turbo decoder,
wherein the fourth decoded instance of the data is the final decoded instance of the data and the CRC is performed on the fourth decoded instance of the data.

23. The method of claim 22, wherein a number of iterations associated with generating decoded instances of the data through the uses of the first turbo decoder, the de-interleaver, and the second turbo decoder is determined as a function of a decoding performance gain from the number of iterations and a decoding delay resulting from the number of iterations.

24. An apparatus for wireless communications, comprising:
a memory; and
at least one processor, coupled to the memory, and configured to:
receive data, the data including outer turbo encoded, interleaved, inner turbo encoded content, the content including source data portion and a cyclic redundancy check (CRC) portion;
generate a first decoded instance of the data through use of a first turbo decoder, the first turbo decoder decodes an inner turbo encoded portion of the received data;
generate a de-interleaved instance of the data based on the first decoded instance of the data through use of a de-interleaver;
generate a second decoded instance of the data from the de-interleaved instance of the data through use of a second turbo decoder, the second turbo decoder decodes an outer turbo encoded portion of the received data; and
perform a CRC on a final decoded instance of the data to determine whether the data is successfully received,
wherein the CRC unperformed on decoded instances of the data other than the final decoded instance of the data.

25. The apparatus of claim 24, wherein the at least one processor is further configured to:
transmit an acknowledgement (ACK) or negative acknowledgement (NACK) based on a result of the performed CRC.

26. The apparatus of claim 24, wherein the first turbo decoder and the second turbo decoder each includes Bahl, Cocke, Jelinek and Raviv (BCJR) decoders.

27. The apparatus of claim 24, wherein the first turbo decoder and second turbo decoder are in series with each other.

28. The apparatus of claim 24, wherein the first decoded instance of the data is provided to the de-interleaver as logarithmic likelihood ratios (LLRs).

29. The apparatus of claim 24, wherein the at least one processor is further configured to:
generate a third decoded instance of the data, based on the second decoded instance generated by the second turbo decoder, through use of the first turbo decoder;

generate a second de-interleaved instance of the data, based on the third decoded instance of the data, through use of the de-interleaver; and generate a fourth decoded instance of the data from the second de-interleaved instance of the data through use of the second turbo decoder, wherein the fourth decoded instance of the data is the final decoded instance of the data and the CRC is performed on the fourth decoded instance of the data.

30. The apparatus of claim 29, wherein a number of iterations associated with generation of decoded instances of the data through the uses of the first turbo decoder, the de-interleaver, and the second turbo decoder is determined as a function of a decoding performance gain from the number of iterations and a decoding delay resulting from the number of iterations.

* * * * *